United States Patent
Mukai et al.

(10) Patent No.: US 8,189,412 B2
(45) Date of Patent: May 29, 2012

(54) STORAGE DEVICE AND METHOD FOR CONTROLLING STORAGE DEVICE

(75) Inventors: Minoru Mukai, Tokyo (JP); Kenji Hirohata, Tokyo (JP); Tomoko Monda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 379 days.

(21) Appl. No.: 12/509,555

(22) Filed: Jul. 27, 2009

(65) Prior Publication Data

US 2010/0082913 A1    Apr. 1, 2010

(30) Foreign Application Priority Data

Sep. 26, 2008   (JP) .................................. 2008-248328

(51) Int. Cl.
   *G11C 29/00* (2006.01)
(52) U.S. Cl. ............... 365/201; 365/189.011; 365/205; 365/206; 365/207; 711/100; 711/101; 711/154; 711/E12.001
(58) Field of Classification Search .................. 365/201, 365/205, 206, 207, 189.011; 711/154, 100, 711/101, E12.001
See application file for complete search history.

(56) References Cited

U.S. PATENT DOCUMENTS

| | | | | |
|---|---|---|---|---|
| 6,141,736 A | * | 10/2000 | Abert et al. | .................... 711/156 |
| 7,974,793 B2 | * | 7/2011 | Weddle | .......................... 702/58 |
| 2008/0310130 A1 | | 12/2008 | Monda et al. | |
| 2009/0190317 A1 | | 7/2009 | Monda et al. | |
| 2010/0070204 A1 | * | 3/2010 | Monda et al. | .................... 702/35 |

FOREIGN PATENT DOCUMENTS

| | | |
|---|---|---|
| JP | 2003-330815 | 11/2003 |
| JP | 2005-018329 | 1/2005 |
| JP | 2005-174203 | 6/2005 |
| JP | 2006-524373 | 10/2006 |
| JP | 2008-112452 | 5/2008 |
| JP | 2008-139927 | 6/2008 |
| JP | 2008-237935 | 10/2008 |

* cited by examiner

*Primary Examiner* — Pho M Luu
(74) *Attorney, Agent, or Firm* — Turocy & Watson, LLP

(57) ABSTRACT

A storage device includes: a printed circuit board; a semiconductor memory package mounted on the printed circuit board via solder joints, the semiconductor memory package incorporating semiconductor memories; a sensor configured to measure a physical quantity relating to a state of the storage device; a database including a damage estimation model base to be used for estimating damage of the solder joints from the physical quantity measured by the sensor; a damage estimating module configured to calculate a damage estimation value of the solder joints from the physical quantity using the damage estimation model base; and a controller configured to control writing, reading, and erasure of electronic data to or from the semiconductor memories based on the damage estimation values calculated by the damage estimating module.

8 Claims, 5 Drawing Sheets

STORAGE DEVICE AND METHOD FOR CONTROLLING STORAGE DEVICE

CROSS-REFERENCE TO THE RELATED APPLICATION(S)

The present disclosure relates to the subject matters contained in Japanese Patent Application No. 2008-248328 filed on Sep. 26, 2008, which are incorporated herein by reference in its entirety.

FIELD

The present invention relates to a storage device provided with semiconductor memories and a damage estimating system and a method for controlling the storage device.

BACKGROUND

With the increase in the grade and the number of functions of apparatus incorporating electronic components, the number of solder joints that connect electronic components to a printed circuit board has come to be very large. As a result, in designing an electronic apparatus, it is important to secure sufficient reliability of such solder joints.

There are electronic apparatus which are equipped with a storage device using semiconductor memories such as flash memories. In a BGA semiconductor package incorporating semiconductor memories, the semiconductor memories are mounted on a printed circuit board via solder bumps. The solder bumps are associated with various problems relating to the reliability of joining. And a particularly important problem is reduction in reliability due to the difference between the linear expansion coefficients of a BGA semiconductor memory package and a printed circuit board.

In an electronic apparatus, a temperature variation occurs repeatedly because of an operation of the apparatus and a variation in ambient temperature. During that course, solder bumps receive strong stress repeatedly due to the difference between the linear expansion coefficients of a BGA semiconductor memory package and a printed circuit board, resulting in fatigue cracks at a high probability. If the fatigue cracks advance to cause fatigue fracture, electrical continuity with the semiconductor memory concerned is lost there. The presence of this phenomenon lowers the reliability of the electronic apparatus to a large extent.

Where a storage device incorporates plural semiconductor memory packages, the level of thermal stress imposed is not uniform among the semiconductor memory packages. For example, it goes without saying that the level of thermal stress is higher and solder bumps suffer fatigue fracture sooner in semiconductor memories that are located in the vicinity of another component that heats to a high temperature (high heating component) or a support member of a printed circuit board than in the other semiconductor memories.

In connection with the reliability of semiconductor devices, a wear-leveling technique for performing rewriting on a large number of storage elements uniformly is well known as a technique for coping with the issue of the upper limit of the number of times of rewriting of each storage element. An example of such technique is disclosed in JP-A-2008-139927.

However, the technique disclosed in JP-A-2008-139927 is directed to detection of deterioration of memory cells and is hardly related to the reliability of solder mounting of a semiconductor memory package on a printed circuit board.

Thermal stress occurs repeatedly between a semiconductor memory package incorporating semiconductor memories and a printed circuit board due to the difference between their linear expansion coefficients. As a result, fatigue fracture may occur in solder bumps that connect them. In that event, trouble may occur in accessing the semiconductor memory concerned, that is, in writing or reading electronic data to or from it. In particular, there may occur trouble that valuable stored data is rendered unreadable.

SUMMARY

According to an aspect of the invention, there is provided a storage device including: a printed circuit board; a semiconductor memory package mounted on the printed circuit board via solder joints, the semiconductor memory package incorporating semiconductor memories; a sensor configured to measure a physical quantity relating to a state of the storage device; a database including a damage estimation model base to be used for estimating damage of the solder joints from the physical quantity measured by the sensor; a damage estimating module configured to calculate a damage estimation value of the solder joints from the physical quantity using the damage estimation model base; and a controller configured to control writing, reading, and erasure of electronic data to or from the semiconductor memories based on the damage estimation values calculated by the damage estimating module.

According to another aspect of the invention, there is provided a storage device including: a printed circuit board; a semiconductor memory package mounted on the printed circuit board via solder joints, the semiconductor memory package incorporating semiconductor memories; a dummy solder joint disposed on the printed circuit board, the dummy solder joint being designed to have faster progress of damage and a shorter fracture life than the solder joints; a database including a damage estimation model base to be used for estimating damage of the solder joints from an electrical property of the solder joints; a damage estimating module configured to calculate a damage estimation value of the solder joints from an electrical property of the dummy solder joint using the damage estimation model base; and a controller configured to control writing, reading, and erasure of electronic data to or from the semiconductor memories based on the damage estimation values calculated by the damage estimating module.

According to another aspect of the invention, there is provided a method for controlling a storage device having a semiconductor memory package being mounted on a printed circuit board via solder joints, the method including: measuring a physical quantity relating to a state of the storage device; calculating a damage estimation value of the solder joints from the physical quantity using a damage estimation model base; and controlling writing, reading, and erasure of electronic data to or from the semiconductor memories based on the damage estimation values.

BRIEF DESCRIPTION OF THE DRAWINGS

A general configuration that implements the various feature of the invention will be described with reference to the drawings. The drawings and the associated descriptions are provided to illustrate embodiments of the invention and not to limit the scope of the invention.

DETAILED DESCRIPTION OF THE EMBODIMENTS

Figure 1:
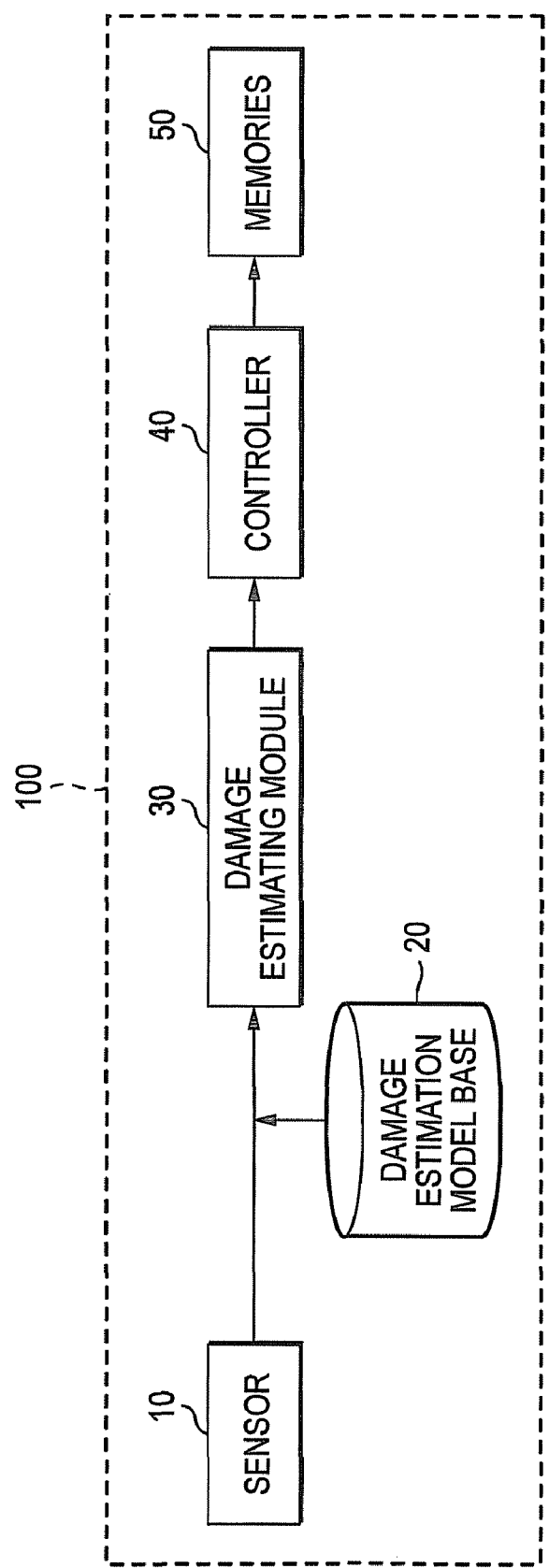
FIG. 1 is a block diagram showing a general configuration of a storage device incorporating a damage estimating method according to a first embodiment of the present invention.

Hereinafter, an embodiment of the invention will be described with reference to the drawings. In the following description, the same or similar components will be denoted by the same reference numerals, and the duplicate description thereof will be omitted.

FIG. 1 is a block diagram showing a general configuration of a storage device provided with a damage estimating method according to a first embodiment of the invention. As shown in FIG. 1, the storage device 100 is equipped with a sensor 10, a damage estimation model base 20, a damage estimating module 30, a controller 40, and memories 50. The sensor 10 is disposed near the semiconductor memories 50 provided in the storage device 100 and detects a physical quantity (i.e. physical value, physical property) relating a state of the storage device 100. Preferable examples of the physical quantity relating a state of the storage device 100 are temperature, strain, stress, and acceleration. Where the physical quantity is temperature, the sensor 10 can be a well-known temperature sensor, for example.

For example, response curved surface data to be used for calculating a damage estimation value of solder joints 14 (see FIG. 2) of the storage device 100 on the basis of information relating to the states of the solder joints 14 and their design information are accumulated in the damage estimation model base 20.

The damage estimating module 30 calculates a damage estimation value of the solder joints 14 by receiving a physical quantity (e.g., temperature variation range) measured by the sensor 10 and taking in the response curved surface data from the damage estimation model base 20. The calculated damage estimation value of the solder joints 14 is sent to the controller 40.

If the damage estimation value of the solder joints 14 exceeds a predetermined range (described later), the controller 40 selectively controls the writing, reading, and erasure of electronic data to or from the memories 50 and issues an instruction to move or copy the data stored in the memories 50. Although in the embodiment the sensor 10, the damage estimating module 30, and the controller 40 are provided in the storage device 100, all or part of them may be located outside the storage device 100. The storage device 100 may be an SSD (solid-state drive) incorporating flash memories.

Figure 2:
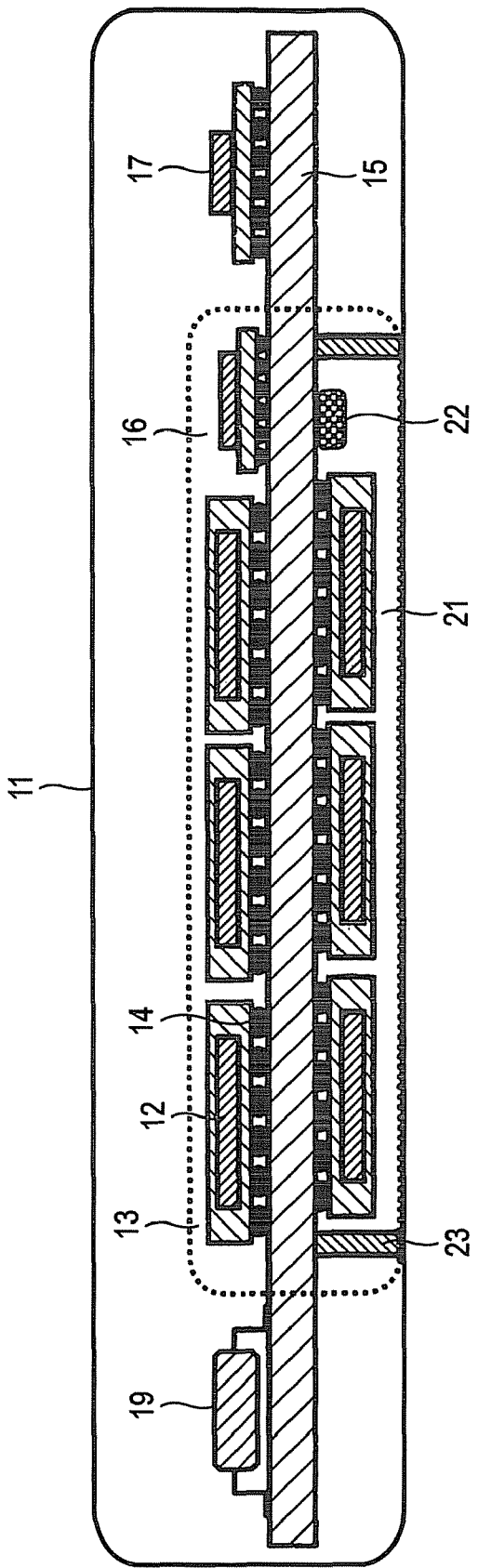
FIG. 2 is a schematic sectional view showing the configuration of an electronic apparatus incorporating the storage device capable of damage estimation according to the first embodiment.

FIG. 2 is a schematic sectional view showing the configuration of an electronic apparatus incorporating the storage device capable of damage estimation according to the embodiment. As shown in FIG. 2, in the electronic apparatus 11, the storage device is configured in such a manner that semiconductor memory packages 13 and 21 are mounted on both surfaces of a printed circuit board 15. The semiconductor memory packages 13 and 21 may be BGA semiconductor memory packages. Each of the semiconductor memory packages 13 and 21 incorporates plural semiconductor memories 12. A memory control chip 16 for controlling the semiconductor memories 12, a CPU 17 for controlling the entire operation of the electronic apparatus 11, a high heating component 19, and a temperature sensor 22 are also mounted on the printed circuit board 15. The high heating component 19 is not a component having any special function but a component that generates a particularly large amount of heat among the components of the electronic apparatus 11. It can be said that semiconductor memories 12 that are disposed in the vicinity of the high heating component 19 are more prone to damage than semiconductor memories 12 that are away from the high heating component 19. The temperature sensor 22 is disposed near the semiconductor memories 12 and measures temperature as a physical quantity. The printed circuit board 15 is supported by support members 23. The semiconductor packages 13 and 21 are connected to the printed circuit board 15 by solder bumps 14.

Figure 3:
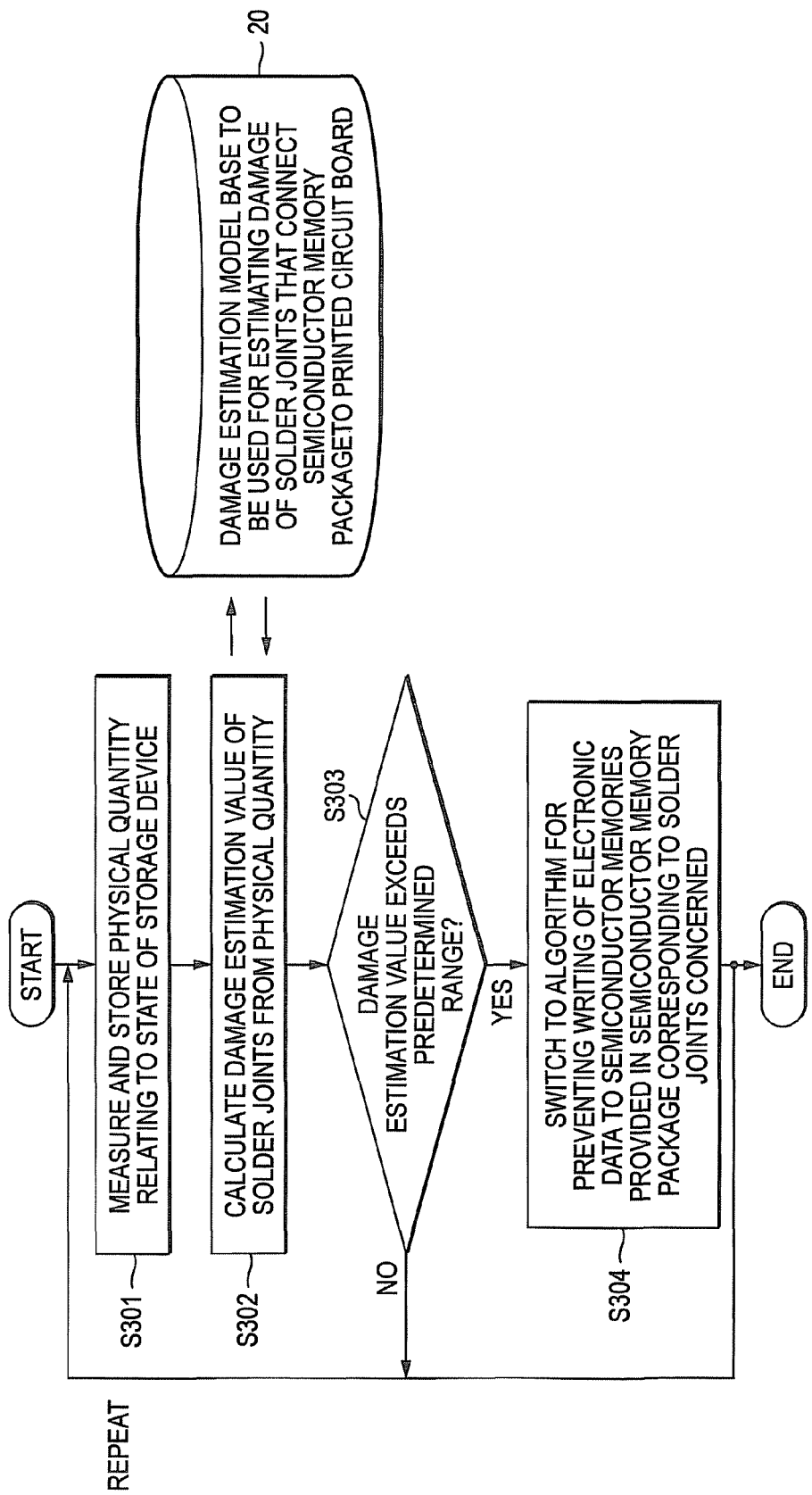
FIG. 3 is a flowchart of the damage estimating method of the storage device according to the first embodiment.

FIG. 3 is a flowchart of the damage estimating method of the storage device.

First, at step S301, a physical quantity relating to a state of the storage device is measured and stored. In the embodiment, the sensor 22 which is disposed near the semiconductor memories 12 measures temperature. The measured temperature is stored in a memory as data.

At step S302, a damage estimation value of the solder bumps 14 is calculated from the physical quantity. The calculated estimation value is substituted into the damage estimation model base 20 to be used for estimating damage of the solder bumps 14 that connect the semiconductor memory packages 13 to the printed circuit board 15.

The damage estimation value will be described below. In general, an electronic apparatus is powered on every time it is used and is powered off every time its use is finished. Thermal stress is imposed on components provided in the electronic apparatus as it is powered on and off repeatedly. When an electronic apparatus is used in a moving vehicle or is dropped, vibration is imposed on electronic components provided inside the electronic apparatus. Such thermal stress and vibration which are imposed on the electronic components affect their damage or life. Example indices representing such damage or a life are a fracture life, a damage value, a function using the fracture life, and a function using the damage value.

The damage value can be defined in the following manner. The damage value that occurs when a repetitive load is imposed in one cycle is given by the reciprocal of the life cycle number that is obtained when the same repetitive load is applied repeatedly. The damage value that occurs when a load is imposed repeatedly is an accumulation of damage values occurring in individual cycles. The accumulation of damage values that has reached "1" means that the solder joint has been damaged.

The damage estimation model base 20 used in the embodiment incorporates a function of calculating strain that occurs in the solder bumps 14 of each of the semiconductor memory packages 13 and 21 from a history of temperature data acquired at the representative point by the temperature sensor 22 and a solder material fatigue life database to be used for converting the calculated strain into a fatigue life of the solder bumps 14. Therefore, in the embodiment, a damage value of the solder bumps 14 of each of the semiconductor memory packages 13 and 21 is calculated from a history of measured temperature data. These pieces of processing are controlled by the CPU 17.

As shown in FIG. 2, the high heating component 19 and the support members 23 of the printed circuit board 15 are disposed near the semiconductor memory package 13. As a result, a higher level of thermal stress occurs in the semiconductor memory package 13 than in the semiconductor memory package 21. Therefore, it is expected that the damage value of the solder bumps 14 of the semiconductor memory package 13 increases faster (i.e., the risk of their fatigue fracture increases faster) than that of the semiconductor memory package 21.

A damage value of the solder bumps 14 of only the semiconductor memory package 13 which are expected to suffer fatigue fracture sooner is estimated, and it is judged at step S303 whether the damage estimation value exceeds a predetermined range.

The data held by the damage estimation model base are referred to for estimating what stress is caused by a temperature variation range that is associated with a single use of the electronic apparatus and to what damage value the estimated stress corresponds. In general, metal materials themselves as typified by solder have variations. Therefore, as for the use of a metal material, the safety factor which is the ratio of the allowable stress (determined according to conditions employed at a designing stage) within which a member concerned is not broken or deformed to its breakage/deformation limit stress (reference strength) which is determined by the characteristics of the material used is taken into consideration. In the embodiment, a design margin like the safety factor is taken into consideration in dealing with the damage value. For example, if the damage estimation value has reached a predetermined range that is 50% to 60% of the limit value, it is inferred that the probability of occurrence of damage is very high. Therefore, in the embodiment, if the damage estimation value exceeds the predetermined range, the CPU 17 gives an instruction to the memory control chip 16. The instruction is to the effect that switching should be made to an algorithm for preventing writing of electronic data to the semiconductor memories 12 provided in the semiconductor memory package 13 corresponding to the solder joints 14 concerned (step S304)

Where a semiconductor memory that would be fatigue-broken earliest could be predicted at the designing stage, a damage value may be calculated only for its solder joints. Furthermore, a procedure is possible in which a damage value of the solder joints of each of plural semiconductor memories is calculated and an instruction is given to only semiconductor memories whose damage estimation values exceed the predetermined range.

Figure 4:
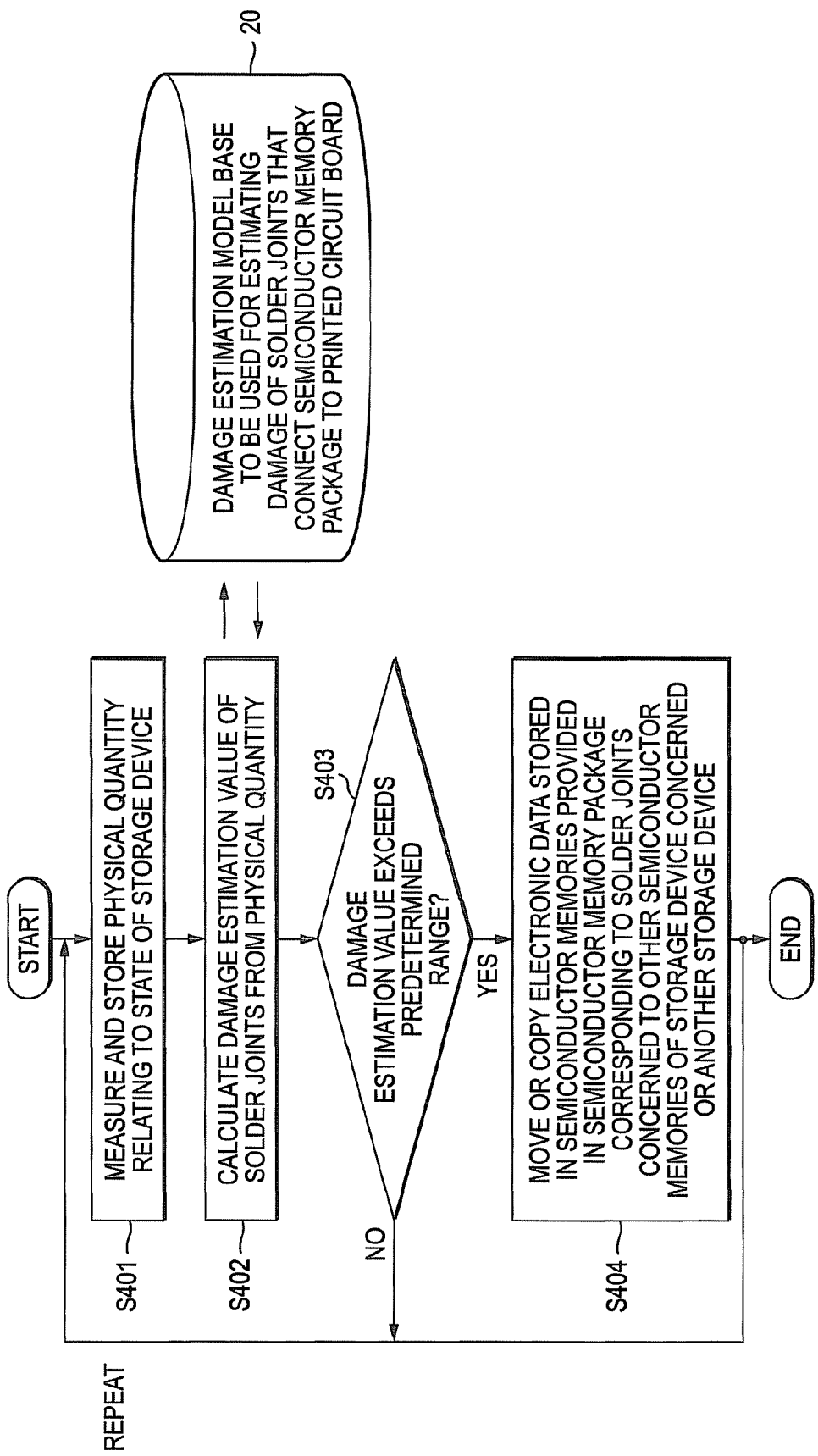
FIG. 4 is a flowchart of a damage estimating method of a storage device according to a modification of the first embodiment.

Next, a modification of the first embodiment will be described. FIG. 4 is a flowchart of a damage estimating method of a storage device according to the modification. As shown in FIG. 4, steps S401-S403 of this modification are the same as the above-described steps S301-303. The difference resides in the contents of the instruction that is issued to the memory control chip 16 from the CPU 17 for semiconductor memories whose damage estimation value of the solder joints 14 exceeds the predetermined range. More specifically, in the modification, electronic data stored in the semiconductor memories provided in the semiconductor memory package 13 which are connected to the printed circuit board 15 via the solder joints 14 concerned are moved or copied to other semiconductor memories 12 of the storage device 100 or another storage device (step S404). For example, "other semiconductor memories 12 of the storage device 100" are the semiconductor memories 12 provided in the semiconductor memory package 21. For example, "another semiconductor device" is a hard disk drive or an optical disc device.

In moving the electronic data to other semiconductor memories 12, it is desirable to use the wear-leveling technique to avoid a phenomenon that the writing of electronic data is concentrated on a particular memory block of a particular semiconductor memory and that memory block wears extremely and reaches the end of its life. To this end, it is preferable to manage the number of times of writing for each block and to select blocks having low writing frequencies as writing subject blocks. Example methods for leveling the numbers of times of writing are 1) to select blocks that are small in the number of times of writing and 2) to prevent concentration of writing on a particular block. In the first method, a block that is smallest in the number of times of writing is selected from all blocks and employs it as a candidate for a subject block of the next writing. For example, what is called cold blocks are used which hold, with no alteration, data that were written at the time of shipment from a factory. Since data stored in cold blocks are low in the probability of rewriting, moving data from blocks that have become relatively high in the number of times of writing to cold blocks makes it possible to write data to the source blocks that are low in the frequency of writing. In the second method, only spent areas and blocks having free areas are employed as candidates for subject areas or blocks of writing. The performance is made simple because of no useless data transfers.

A measure of moving electronic data to semiconductor memories 12 corresponding to solder joints 14 that are as distant from the high heating component 19 or the support members 23 of the printed circuit board 15 as possible may be taken in addition to the above-described leveling of the numbers of times of writing.

The above description is directed to the control of the electronic data storage in the semiconductor memories 12 provided in the BGA semiconductor memory packages 13 and 21. Entirely the same procedure as described above can be used in the case where the damage estimation value of the solder joints of a component that serves to maintain or control the functions of the semiconductor memories 12, such as the memory control chip 16 or a power circuit (not shown), increases to exceed the predetermined range.

The operating system (OS) and I/O information of the storage device are stored in the memory control chip 16. To prepare for fatigue fracture of the solder joints that connect the memory control chip 16 to the printed circuit board 15, it is preferable to copy the OS and the I/O information to another storage device or semiconductor memories.

The above-described damage estimating method may be performed fully automatically in the electronic apparatus 11 or an alarm may be given to the user of the electronic apparatus 11 to cause the user to select a subsequent measure when the damage estimation value has exceeded the predetermined range.

Figure 5:
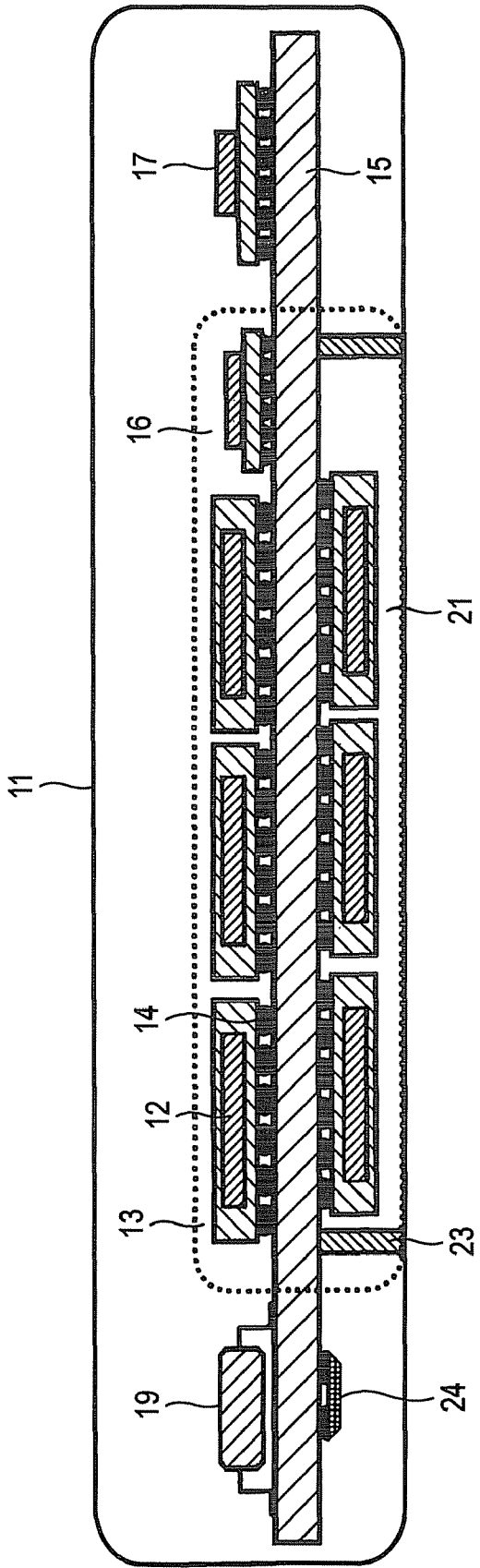
FIG. 5 is a schematic sectional view showing the configuration of an electronic apparatus incorporating a storage device capable of damage estimation according to a second embodiment.

Next, a second embodiment of the invention will be described. FIG. 5 is a schematic sectional view showing the configuration of an electronic apparatus incorporating a storage device capable of damage estimation according to a second embodiment. As shown in FIG. 5, in the electronic apparatus 11a, the storage device is configured in such a manner that semiconductor memory packages 13 and 21 are mounted on both surfaces of a printed circuit board 15. The semiconductor memory packages 13 and 21 may be BGA semiconductor memory packages. Each of the semiconductor memory packages 13 and 21 incorporates plural semiconductor memories 12. A memory control chip 16 for controlling the semiconductor memories 12, a CPU 17 for controlling the entire operation of the electronic apparatus 11a, a high heating component 19, and a dummy solder joint 24 are also mounted on the printed circuit board 15. The printed circuit board 15 is supported by support members 23. The dummy solder joint 24 is designed so as to be damaged faster and hence have a shorter fracture life than the solder bumps 14 that connect the semiconductor memory packages 13 and 21 to the printed circuit board 15. For example, when the solder bumps 14 have such a life as to survive 10,000 times of repetitive use, the dummy solder joint 24 is designed so as to survive 5,000 times of repetitive use, that is, to have a life that is a half of the life of the solder bumps 14.

There are various designing methods that cause differences in life. Where the dummy solder joint 24 is disposed on the back surface of the printed circuit board 15 right under the high heating component 19 which is mounted on the printed circuit board 15, the temperature variation range of the dummy solder joint 24 is wider than that of each of the other components. Therefore, the thermal-fatigue-causing load on the dummy solder joint 24 is heavier than that on the solder bumps 14 and hence the life of the dummy solder joint 24 becomes even shorter.

In this case, the physical quantity relating to the state of the storage device is an electrical property of the solder bumps 14. In general, it is preferable that the physical quantity be electrical resistance or capacitance. The dummy solder joint 24, which is generally called a canary device, may be either an independent device as in the embodiment or a device that is integral with the semiconductor package 13. A measured electrical property is stored in a memory as data and substituted into the damage estimation model base 20 to be used for estimating damage of the solder joints 14 that connect the semiconductor memory packages 13 and 21 to the printed circuit board 15. The damage estimation model base 20 was generated in advance at the time of designing of the electronic apparatus 11a and is provided in the electronic apparatus 11a. In the embodiment, a damage estimation value of the solder bumps 14 corresponding to each of the two semiconductor memory packages 13 and 21 is calculated on the basis of the measured electrical property of the dummy solder joint 24. For example, if fatigue fracture of the dummy solder joint 24 is detected from an increase in electrical resistance, a damage estimation value of the solder bumps 14 of each of the semiconductor packages 13 and 21 is calculated on the basis of the information in the model base 20 that the life to fatigue fracture of the dummy solder joint 24 is set shorter than that of the solder bumps 14 by a predetermined percentage. These pieces of processing are controlled by the CPU 17.

Steps that are executed after the calculation of the damage estimation value are the same as in the first embodiment and hence will not be described below.

According to the embodiment, the electronic data stored in the semiconductor memories provided in each semiconductor memory package can be prevented from being rendered unreadable due to fatigue fracture of the solder joints that connect the semiconductor memory packages to the printed circuit board.

It is to be understood that the invention is not limited to the specific embodiments described above and that the invention can be embodied with the components modified without departing from the spirit and scope of the invention. The invention can be embodied in various forms according to appropriate combinations of the components disclosed in the embodiments described above. For example, some components may be deleted from the configurations described as the embodiments. Further, the components described in different embodiments may be used appropriately in combination.

What is claimed is:

1. A storage device comprising a plurality of semiconductor memory packages, each being mounted with a semiconductor memory, mounted on a printed circuit broad via a joining portion, the storage device comprising:
    a sensor that measures a physical quantity relating to a state of the storage device;
    a database that accumulates a damage estimation model base to be used for estimating damage of the joining portion from the physical quantity;
    a damage estimating unit that calculates an estimation value of a damage of the joining portion from the physical quantity using the damage estimation model base;
    a controller that selectively controls writing, reading, and erasing of electronic data to and from the semiconductor memory mounted on the semiconductor memory packages that are mounted via the joining portion according to the estimation value; and
    a semiconductor device for controlling memory, which stores an operating system and I/O information,
        wherein when the estimation value exceeds a predetermined range, the controller moves or copies the operating system and the I/O information stored in the semiconductor device for controlling memory to other semiconductor memory or to another storage device.

2. The storage device according to claim 1,
wherein the physical quantity is at least one of temperature, strain, stress, and acceleration.

3. The storage device according to claim 1,
wherein the joining portion is a solder joining portion, and the damage estimating unit calculates strain occurring in the solder joining portion from the measured physical quantity using the damage estimation model base, and estimates distortion of the solder joining portion based on the calculated strain and a solder material fatigue life database.

4. The storage device according to claim 1,
wherein when the estimation value exceeds a predetermined range, the controller lowers a priority of the writing of the electronic data to the semiconductor memory mounted on the semiconductor memory package that is mounted via the joining portion.

5. The storage device according to claim 1,
wherein when the estimation value exceeds a predetermined range, the controller moves or copies the electronic data stored in the semiconductor memory mounted on the semiconductor memory package mounted via the joining portion to other semiconductor memory in the storage device.

6. The storage device according to claim 1,
wherein when the estimation value exceeds a predetermined range, the controller means or copies electronic data stored in the semiconductor memory mounted on the semiconductor memory package mounted via the joining portion to another storage device.

7. A storage device comprising a plurality of semiconductor memory packages, each being mounted with a semiconductor memory, mounted on a printed circuit board via a joining portion, the storage device comprising:
    a detection joining portion that is designed so as to have a shorter fracture life by having faster process of damage than the joining portion;
    a database that accumulates a damage estimation model base to be used for estimating damage of the joining portion from an electrical property of the joining portion;
    a damage estimating unit that calculates an estimation value of a damage of the joining portion from an electrical property of the detection joining portion using the damage estimation model base;

a controller that selectively controls writing, reading, and erasing of electronic data to and from the semiconductor memory mounted on the semiconductor memory packages that are mounted via the joining portion according to the estimation value; and a semiconductor device for controlling memory, which stores an operating system and I/O information, wherein when the estimation value exceeds a predetermined range, the controller moves or copies the operating system and the I/O information stored in the semiconductor device for controlling memory to other semiconductor memory or to another storage device.

8. A method for controlling a storage device comprising a plurality of semiconductor memory packages, each being mounted with a semiconductor memory, mounted on a printed circuit board via a joining portion, the method comprising:

measuring a physical quantity relating to a state of the storage device;

calculating an estimation value of a damage of the joining portion from physical quantity using a damage estimation model base;

selectively controlling writing, reading, and erasing of electronic data to and from the semiconductor memory mounted on the semiconductor memory packages that are mounted via the joining portion according to the estimation value; and a semiconductor device for controlling memory, which stores an operating system and I/O information, wherein when the estimation value exceeds a predetermined range, the controller moves or copies the operating system and the I/O information stored in the semiconductor device for controlling memory to other semiconductor memory or to another storage device.

* * * * *